(12) United States Patent
Zhang et al.

(10) Patent No.: US 12,389,595 B2
(45) Date of Patent: Aug. 12, 2025

(54) THREE-DIMENSIONAL MEMORY COMPRISING STORAGE UNIT AND LOGIC CONTROL UNIT AND METHOD FOR MANUFACTURING THE SAME

(71) Applicant: INSTITUTE OF MICROELECTRONICS, CHINESE ACADEMY OF SCIENCES, Beijing (CN)

(72) Inventors: Gang Zhang, Beijing (CN); Zongliang Huo, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 723 days.

(21) Appl. No.: 17/631,321

(22) PCT Filed: Jul. 29, 2019

(86) PCT No.: PCT/CN2019/098174
§ 371 (c)(1),
(2) Date: Jan. 28, 2022

(87) PCT Pub. No.: WO2021/016804
PCT Pub. Date: Feb. 4, 2021

(65) Prior Publication Data
US 2022/0262812 A1 Aug. 18, 2022

(51) Int. Cl.
*H10B 41/27* (2023.01)
*H01L 23/528* (2006.01)
(Continued)

(52) U.S. Cl.
CPC ......... *H10B 41/27* (2023.02); *H01L 23/5283* (2013.01); *H10B 41/35* (2023.02);
(Continued)

(58) Field of Classification Search
CPC ........ H10B 41/27; H10B 43/27; H10B 41/35; H10B 43/35; H10B 41/40; H10B 43/40; H01L 23/5283
(Continued)

(56) References Cited

U.S. PATENT DOCUMENTS

2015/0179660 A1   6/2015  Yada et al.
2016/0307632 A1*  10/2016 Lee .................. H01L 23/53271
(Continued)

FOREIGN PATENT DOCUMENTS

CN     104409421 A    3/2015
CN     105261617 A    1/2016
(Continued)

*Primary Examiner* — Didarul A Mazumder
(74) *Attorney, Agent, or Firm* — Christensen, Fonder, Dardi & Herbert PLLC; John P. Fonder

(57) ABSTRACT

A three-dimensional memory and a method for manufacturing the three-dimensional memory, the three-dimensional memory includes a storage unit and a logic control unit, a front of the storage unit and a front of the logic control unit are attached to each other, and the logic control unit is connected to a control circuit, wherein a second metal line of the storage unit and a first metal line of the storage unit are respectively disposed on upper and lower sides of a channel layer of the storage unit, and the first metal line and the second metal line are electrically connected to the control circuit.

13 Claims, 4 Drawing Sheets

(51) Int. Cl.
    *H10B 41/35*     (2023.01)
    *H10B 41/40*     (2023.01)
    *H10B 43/27*     (2023.01)
    *H10B 43/35*     (2023.01)
    *H10B 43/40*     (2023.01)

(52) U.S. Cl.
    CPC ............. *H10B 41/40* (2023.02); *H10B 43/27* (2023.02); *H10B 43/35* (2023.02); *H10B 43/40* (2023.02)

(58) Field of Classification Search
    USPC .......................................................... 257/314
    See application file for complete search history.

(56) References Cited

U.S. PATENT DOCUMENTS

2019/0164991 A1* 5/2019 Lim .................... G11C 16/0483
2020/0027509 A1* 1/2020 Chen ........................ H01L 24/80
2020/0144242 A1* 5/2020 Park ........................ H01L 24/05
2020/0266146 A1* 8/2020 Nishida ................... H01L 24/73

FOREIGN PATENT DOCUMENTS

| | | |
|---|---|---|
| CN | 106449595 A | 2/2017 |
| CN | 107527914 A | 12/2017 |
| CN | 107658315 A | 2/2018 |
| CN | 107808884 A | 3/2018 |
| CN | 107887395 A | 4/2018 |
| CN | 108447865 A | 8/2018 |
| CN | 109417077 A | 3/2019 |
| CN | 109494226 A | 3/2019 |
| CN | 109755254 A | 5/2019 |
| CN | 109801917 A | 5/2019 |
| CN | 109860197 A | 6/2019 |
| CN | 109904170 A | 6/2019 |

* cited by examiner

THREE-DIMENSIONAL MEMORY COMPRISING STORAGE UNIT AND LOGIC CONTROL UNIT AND METHOD FOR MANUFACTURING THE SAME

CROSS REFERENCE TO RELATED APPLICATION(S)

This application is a Section 371 National Stage Application of International Application No. PCT/CN2019/098174, filed on Jul. 29, 2019, entitled "THREE-DIMENSIONAL MEMORY AND METHOD FOR MANUFACTURING THE SAME", the contents of which is incorporated herein by reference in its entirety.

TECHNICAL FIELD

The present disclosure relates to the field of semiconductor memory and integration technology, and relates to a three-dimensional memory and a method for manufacturing the three-dimensional memory.

BACKGROUND

Three-dimensional (3D) NAND is an emerging type of flash memory that solves limitations of planar (2D) NAND flash memory by stacking memory units. At present, three-dimensional NAND memory technology is currently a country's key technology.

In Xtacking three-dimensional NAND memory architectures, metal lines metal-1, metal-2 and (lower) connecting circuits are faced with a problem of complex circuit design and layout.

SUMMARY

According to an aspect of the present disclosure, a three-dimensional memory is provided, including a storage unit and a logic control unit, a front of the storage unit and a front of the logic control unit are attached to each other, and the logic control unit is connected to a control circuit, wherein a second metal line of the storage unit and a first metal line of the storage unit are respectively disposed on upper and lower sides of a channel layer of the storage unit, and the first metal line and the second metal line are electrically connected to the control circuit.

In the embodiments of the present disclosure, the second metal line is disposed in a substrate of the storage unit and insulated from the substrate; and the first metal line of the storage unit is disposed on the front of the storage unit.

In the embodiments of the present disclosure, a plurality of channel holes are disposed in the channel layer of the storage unit, and each of the plurality of channel holes is electrically connected to the first metal line; and a common selection line is electrically connected to the second metal line.

In the embodiments of the present disclosure, a top of the channel hole is electrically connected to the first metal line through a first connecting hole.

In the embodiments of the present disclosure, a bottom of the common selection line is directly electrically connected to the second metal line, or a bottom of the common selection line is electrically connected to the second metal line through a second connecting hole.

In the embodiments of the present disclosure, the first metal line is electrically connected to the logic control unit through a top connecting circuit; and the second metal line is electrically connected to the control circuit through a bottom connecting circuit.

In the embodiments of the present disclosure, a plurality of connecting holes are disposed on a back of the storage unit, tops of the plurality of connecting holes are connected to the control circuit, and the tops of the plurality of connecting holes respectively stop at the top connecting circuit and the bottom connecting circuit.

According to an aspect of the present disclosure, a method for manufacturing a three-dimensional memory is provided, the method includes: respectively disposing a second metal line and a first metal line on upper and lower sides of a channel layer of a storage unit; and attaching a front of the storage unit and a front of a logic control unit to each other, connecting the logic control unit to a control circuit, and electrically connecting the first metal line and the second metal line to the control circuit.

In the embodiments of the present disclosure, the respectively disposing a second metal line and a first metal line on upper and lower sides of a channel layer of a storage unit includes: preparing a substrate; disposing the second metal line in the substrate, wherein the second metal line is insulated from the substrate; epitaxially growing a substrate material on a substrate in which the second metal line is disposed, forming a second connecting hole in the epitaxially grown substrate material, and forming a substrate in which the second metal line and the second connecting hole are internally pre-arranged; growing a stack material of the channel layer on the substrate in which the second metal line and the second connecting hole are internally pre-arranged, patterning the stack material to form a channel hole and a common selection line, wherein a bottom of the common selection line stops at the second connecting hole; forming a first connecting hole and the first metal line on a structure in which the channel hole and the common selection line are formed, forming a storage unit in which the first metal line and the second metal line are respectively disposed on the upper and lower sides of the channel layer.

In the embodiments of the present disclosure, the respectively disposing a second metal line and a first metal line on upper and lower sides of a channel layer of a storage unit includes: preparing a substrate; disposing the second metal line in the substrate, wherein the second metal line is insulated from the substrate; growing a stack material of the channel layer on a substrate in which the second metal line is disposed, patterning the stack material to form a channel hole and a common selection line, wherein a bottom of the common selection line stops at a surface of the second metal line; forming a first connecting hole and the first metal line on a structure in which the channel hole and the common selection line are formed, forming a storage unit in which the first metal line and the second metal line are respectively disposed on the upper and lower sides of the channel layer.

In the embodiments of the present disclosure, the attaching a front of the storage unit and a front of a logic control unit to each other, connecting the logic control unit to a control circuit, and electrically connecting the first metal line and the second metal line to the control circuit includes: forming a top connecting circuit in the storage unit, so that the first metal line is connected to the logic control unit through the top connecting circuit; forming a bottom connecting circuit in the storage unit; attaching the front of the storage unit and the front of the logic control unit to each other; forming a plurality of connecting holes on a back of the storage unit, wherein tops of the plurality of connecting holes are connected to the control circuit, the plurality of connecting holes includes a third connecting hole and a fourth connecting hole, a bottom of the third connecting hole stops at the top connecting circuit, a bottom of the fourth connecting hole stops at the bottom connecting circuit, so that the logic control unit is connected to the control circuit through the third connecting hole to implement an electrical connection between the first metal line and the control circuit, and the second metal line is electrically connected to the control circuit through the bottom connecting circuit and the fourth connecting hole.

DETAILED DESCRIPTION OF EMBODIMENTS

Figure 1:
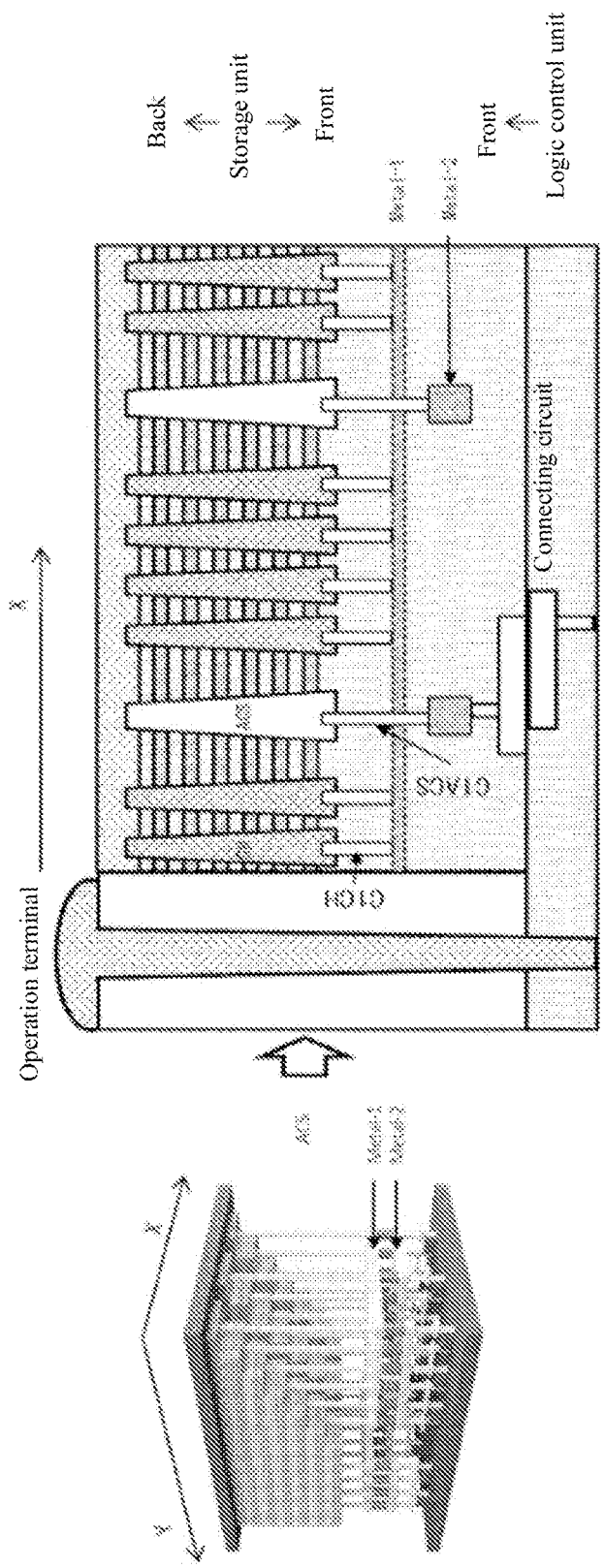
FIG. 1 shows a three-dimensional schematic diagram and a corresponding cross-sectional schematic diagram of a three-dimensional NAND memory in the related art.

FIG. 1 shows a three-dimensional schematic diagram and a corresponding cross-sectional schematic diagram of a three-dimensional NAND memory in the related art. As shown in FIG. 1, in an existing Xtacking three-dimensional NAND memory architecture, a front of a storage unit and a front of a logic control unit are attached, and a back of the storage unit is exposed upward. A channel hole CH of the storage unit is connected to a line metal-1 through a connecting hole C1CH, and a common selection line ACS is connected to a line metal-2 through a connecting hole C1ACS. The connecting hole C1ACS and line metal-1 are staggered and insulated from each other. FIG. 1 shows the line metal-1 with a dashed box to illustrate that there is no cross between the connecting hole C1ACS and the line metal-1, and the connecting hole C1ACS and the line metal-1 are insulated from each other. Both the line metal-1 and the line metal-2 are connected to the logic control unit through a connecting circuit, and the line metal-1 and the line metal-2 are led out a chip operation terminal through a deep hole.

Two main problems exist in the above-mentioned structure. 1. The line metal-1 and line metal-2 are staggered and insulated from each other, the common selection line and the line metal-2 are connected correspondingly, and the channel hole and the line metal-1 are connected correspondingly, and a connection between the common selection line and the line metal-2 and a connection between the channel hole and the line metal-1 are in the same direction and area. In order to implement a staggered and effective connection, the corresponding metal connection and wiring are complicated, and a reliability of the connection is poor due to complicated layouts and process problems. 2. The metal lines are concentrated in a lower part of the storage unit (or a top of the storage unit, upper and lower parts of the storage unit are illustrated in accordance with directions of the drawings of specification, a top and a bottom of the storage unit correspond to a front and a back of the storage unit, the top of the storage unit corresponds to the front of the storage unit, and the bottom of the storage unit corresponds to the back of the storage unit), a silicon structure (substrate) is concentrated on the upper part of the storage unit, and an imbalance structural stress causes deformation of the storage unit.

The present disclosure provides a three-dimensional memory. In the three-dimensional memory, a second metal line of a storage unit and a first metal line of the storage unit are respectively disposed on upper and lower sides of a channel layer of the storage unit. By disposing the first metal line and the second metal line separately, a distribution of the metal lines becomes balanced, and a deformation of the storage unit is reduced or avoided, while a metal wiring is simplified by disposing the first metal line and the second metal line separately, so that layouts of connecting paths between the first metal line, the second metal line and the control circuit are relatively simple, a reliability of connection is improved, and problems of connection reliability caused by complicated layouts and process problems in the related art are avoided.

In order to make objectives, technical solutions, and advantages of the present disclosure clearer, the present disclosure will be further described in detail below in conjunction with specific embodiments and with reference to the drawings.

Figure 2:
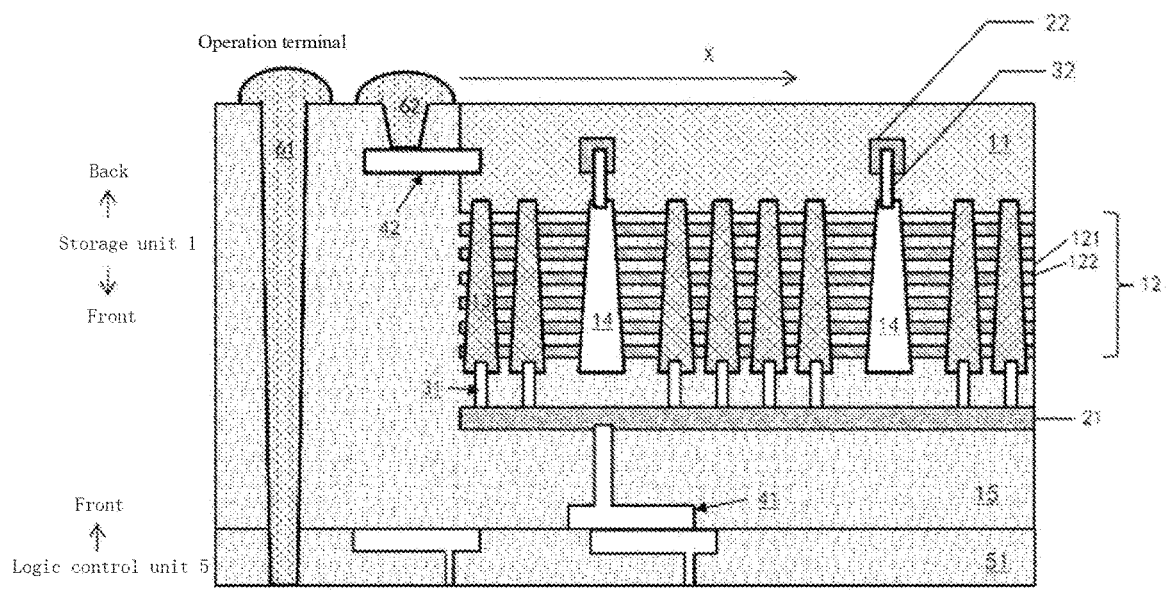
FIG. 2 shows a schematic cross-sectional view of a three-dimensional memory according to an embodiment of the present disclosure.
Figure 3:
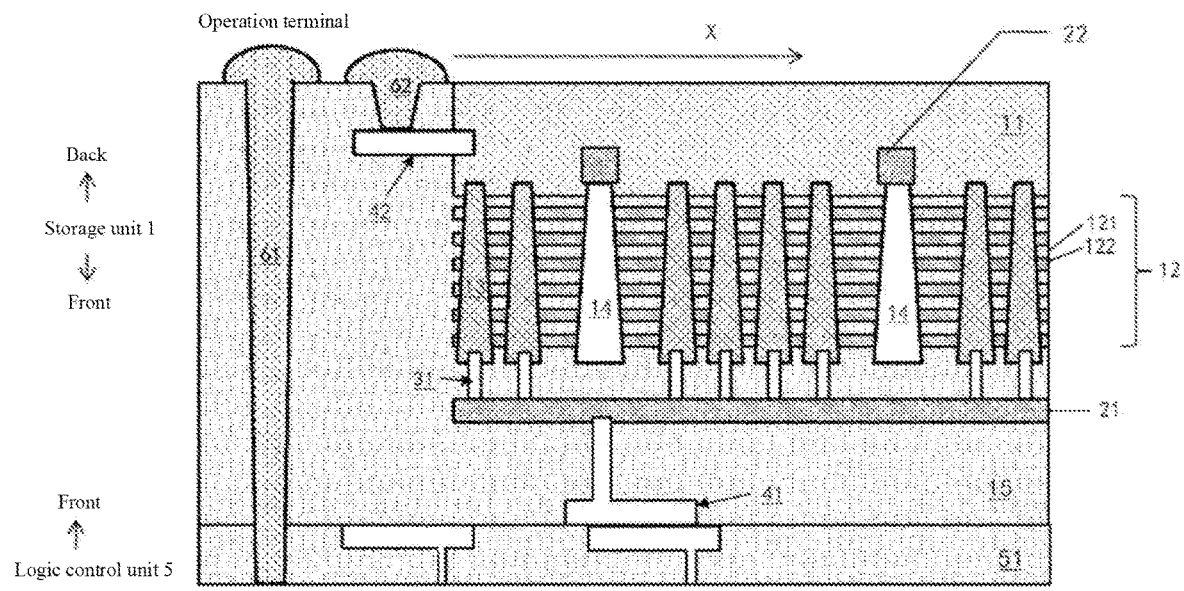
FIG. 3 shows a schematic cross-sectional view of a three-dimensional memory according to an embodiment of the present disclosure.

It should be noted that FIGS. 2 and 3 illustrate directions of a front and a back of a storage unit 1. Accordingly, in a structure description of the storage unit in the present disclosure, terms "top connecting circuit" and "bottom connecting circuit" respectively refer to a observed top and bottom of the storage unit after placing the storage unit face up, and the terms of "upper part" and "lower part" are described in up and down directions corresponding to the drawings in the present disclosure.

In the drawings, the "connecting hole" and "common selection line" are shown as trapezoids, the "top" or "bottom" of the "connecting hole" and "common selection line" is described in accordance with the following principles: according to an etching process during manufacture, an etching width at top is greater than an etching width at bottom, and thus a corresponding long side is "top", and a corresponding short side is "bottom". For example, in FIG. 2, a top of a channel hole 13 is a long side, a bottom of the channel hole 13 is a short side, and the top of the channel hole 13 is electrically connected to a first metal line 21 through a first connecting hole 31; a top of a common selection line 14 is a long side, and a bottom of the common selection line 14 is a short side, and the bottom of the common selection line 14 is electrically connected to a second metal line 22 through a second connecting hole 32; similarly, a long side of a third connecting hole 61 is a top, a short side of the third connecting hole 61 is a bottom, the top of the third connecting hole 61 is connected to a control circuit, and the bottom of the third connecting hole 61 stops at a top connecting circuit 41.

In an exemplary embodiment of the present disclosure, a three-dimensional memory is provided.

FIG. 2 shows a schematic cross-sectional view of a three-dimensional memory according to an embodiment of the present disclosure.

Referring to FIG. 2, the three-dimensional memory of the present disclosure includes the storage unit 1 and a logic control unit 5, the front of the storage unit 1 and a front of the logic control unit 5 are attached to each other, and the logic control unit 5 is connected to the control circuit. The second metal line 22 of the storage unit 1 and the first metal line 21 of the storage unit 1 are respectively disposed on upper and lower sides of a channel layer 12 of the storage unit 1, and both the first metal line 21 and the second metal line 22 are electrically connected to the control circuit.

In FIGS. 2 to 3, the first metal line 21 and the second metal line 22 are directly or indirectly led out a chip operation terminal through a plurality of connecting holes (including a third connecting hole 61 and a fourth connecting hole 62), then the first metal line 21 and the second metal line 22 are connected to the control circuit.

In the embodiment, as shown in FIG. 2, the second metal line 22 is disposed in a substrate 11 of the storage unit 1, and the second metal line 22 is insulated from the substrate 11. The first metal line 21 of the storage unit 1 is disposed on the front of the storage unit 1.

In the embodiments of the present disclosure, the substrate 11 is a silicon substrate or an SOI substrate.

In the embodiment, as shown in FIG. 2, a plurality of channel holes 13 are disposed in the channel layer 12 of the storage unit 1, and each channel hole 13 is electrically connected to the first metal line 21; the common selection line 14 is electrically connected to the second metal line 22.

In the embodiments of the present disclosure, the channel layer 12 is a structure formed by a plurality of stack pairs, for example, a stack pair formed by a first stack material and a second stack material. The first stack material 121 is silicon oxide, and the second stack material 122 is silicon nitride.

In the embodiments of the present disclosure, as shown in FIG. 2, the top of the channel hole 13 is electrically connected to the first metal line 21 through the first connecting hole 31.

In the embodiments of the present disclosure, as shown in FIG. 2, the bottom of the common selection line 14 is electrically connected to the second metal line 22 through the second connecting hole 32.

In the embodiments of the present disclosure, as shown in FIG. 2, the first metal line 21 is electrically connected to the logic control unit 5 through the top connecting circuit 41; the second metal line 22 is electrically connected to the control circuit through a bottom connecting circuit 42.

In the embodiment, the back of the storage unit 1 is disposed with a plurality of connecting holes, tops of the plurality of connecting holes are connected to the control circuit, and the tops of the plurality of connecting holes stop at the top connecting circuit and the bottom connecting circuit, respectively. As shown in FIG. 2, the plurality of connecting holes includes the third connecting hole 61 and the fourth connecting hole 62, tops of the third connecting hole 61 and the fourth connecting hole 62 are connected to the control circuit, the bottom of the third connecting hole 61 stops at the top connecting circuit 41, a bottom of the fourth connecting hole 62 stops at the bottom connecting circuit 42, so that the logic control unit 5 is connected to the control circuit through the third connecting hole 61, an electrical connection between the first metal line 21 and the control circuit is implemented, and the second metal line 22 is electrically connected to the control circuit through the bottom connecting circuit 42 and the fourth connecting hole 62.

In the embodiments of the present disclosure, referring to FIG. 2, a protective layer 15 is formed on a top and a sidewall of the channel layer 12, and a material of the protective layer 15 is, for example, silicon oxide. The third connecting hole 61 and the fourth connecting hole 62 are formed by etching the protective layer 15.

In the embodiment, referring to FIG. 2, a material of a base 51 of the logic control unit 5 is, for example, silicon oxide. A circuit is disposed in the base 51 of the logic control unit 5, and when the front of the logic control unit 5 and the front of the storage unit 1 are attached, a corresponding circuit in the base 51 of the logic control unit 5 is connected to the top connecting circuit 41.

In summary, in the embodiment, the second metal line of the storage unit 1 and the first metal line of the storage unit 1 are respectively disposed on upper and lower sides of the channel layer of the storage unit. By disposing the first metal line and the second metal line separately, the distribution of the metal lines becomes balanced, and the deformation of the storage unit is reduced or avoided, while the metal wiring is simplified by disposing the first metal line and the second metal line separately, so that the layouts of connecting paths between the first metal line, the second metal line and the control circuit are relatively simple, the reliability of connection is improved, and problems of connection reliability caused by complicated layouts and process problems in the related art are avoided.

In an exemplary embodiment of the present disclosure, a three-dimensional memory is provided.

FIG. 3 shows a schematic cross-sectional view of a three-dimensional memory according to an embodiment of the present disclosure. In this embodiment, the same components as the first embodiment shown in FIG. 2 are indicated by same reference numerals.

Referring to FIG. 3, different from the three-dimensional memory of the embodiment shown in FIG. 2, in the three-dimensional memory of the embodiment shown in FIG. 3: a bottom of the common selection line 14 in the three-dimensional memory of the embodiment is directly electrically connected to the second metal line 22, and the second connecting hole 32 in the first embodiment shown in FIG. 2 does not exist in this embodiment.

In an exemplary embodiment of the present disclosure, a method for manufacturing a three-dimensional memory is provided.

Figure 4:
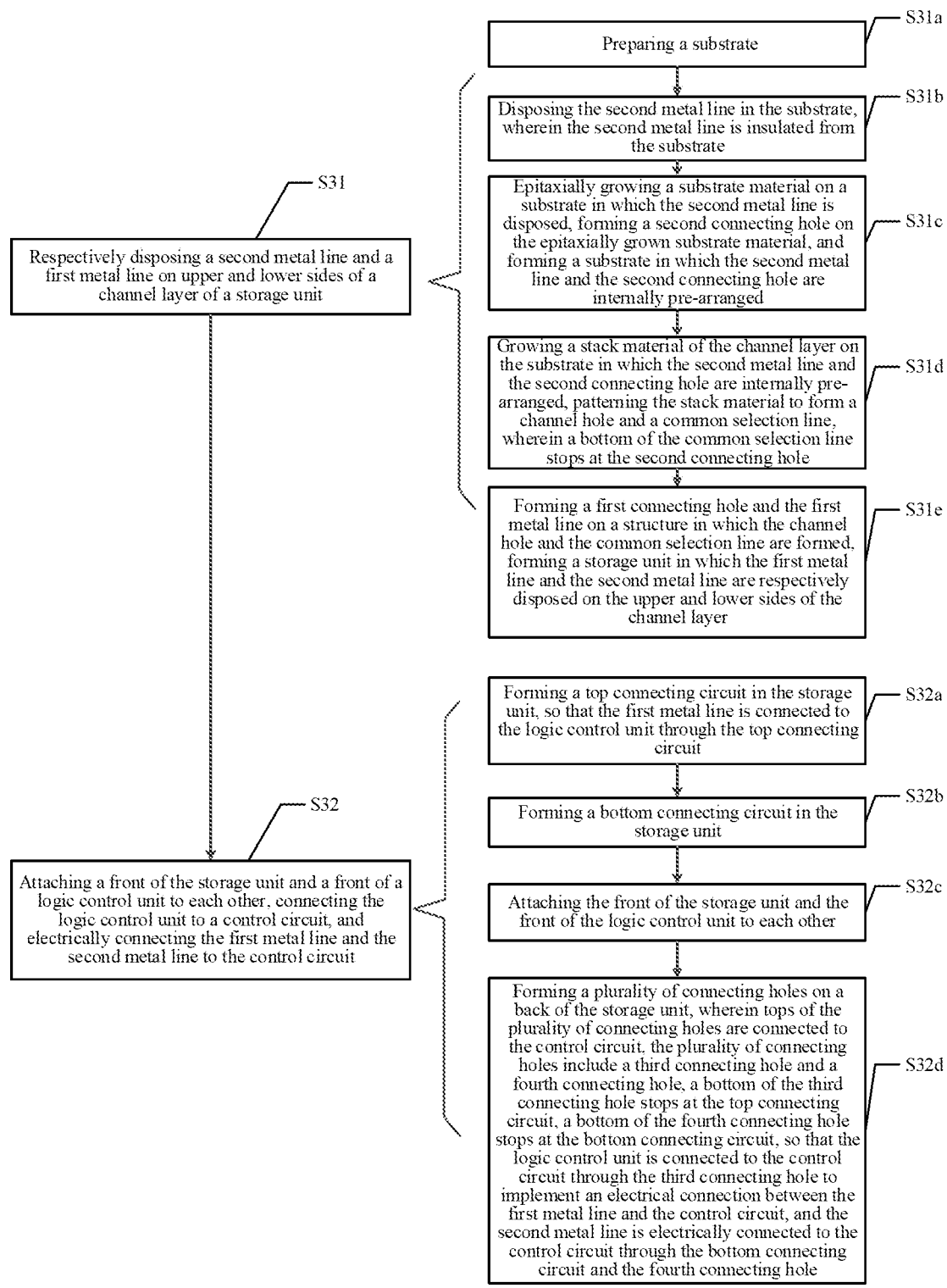
FIG. 4 shows a flowchart of a method for manufacturing the three-dimensional memory shown in FIG. 2 according to an embodiment of the present disclosure.

FIG. 4 shows a flowchart of a method for manufacturing the three-dimensional memory shown in FIG. 2 according to an embodiment of the present disclosure.

Referring to FIG. 4, the method for manufacturing the three-dimensional memory of the present disclosure includes the following steps.

In step S31, a first metal line and a second metal line are disposed on lower and upper sides of a channel layer of a storage unit, respectively.

In this embodiment, the step S31 includes sub-step S31a, sub-step S31b, sub-step S31c, sub-step S31d, and sub-step S31e.

In sub-step S31a, a substrate 11 is prepared.

In sub-step S31b, the second metal line 22 is disposed in the substrate 11 and insulated from the substrate 11.

In sub-step S31c, a substrate material is epitaxially grown on the substrate 11 in which the second metal line 22 is disposed, and a second connecting hole 32 is formed in the epitaxially grown substrate material, and a substrate in which the second metal line 22 and the second connecting hole 32 are internally pre-arranged is formed.

In sub-step S31d, a stack material of the channel layer 12 is grown on the substrate in which the second metal line 22 and the second connecting hole 32 are internally pre-arranged, and the stack material is patterned to form a channel hole 13 and a common selection line 14, and a bottom of the common selection line 14 stops at the second connecting hole 32.

In sub-step S31e, a first connecting hole 31 and a first metal line 21 are formed on a structure in which the channel hole 13 and the common selection line 14 are formed, and a storage unit in which the first metal line 21 and the second metal line 22 are respectively disposed on the upper and lower sides of the channel layer 12 is formed.

In step S32, a front of the storage unit and a front of a logic control unit are attached to each other, the logic control unit is connected to a control circuit, and both the first metal line and the second metal line are electrically connected to the control circuit.

In this embodiment, the step S32 includes sub-step S32a, sub-step S32b, sub-step S32c, and sub-step S32d.

In sub-step S32a, a top connecting circuit 41 is formed in the storage unit 1, so that the first metal line 21 is connected to the logic control unit 5 through the top connecting circuit 41.

In sub-step S32b, a bottom connecting circuit 42 is formed in the storage unit 1.

In sub-step S32c, the front of the storage unit 1 and the front of the logic control unit 5 are attached to each other.

In sub-step S32d, a plurality of connecting holes are formed on a back of the storage unit 1, tops of the plurality of connecting holes are connected to the control circuit, the plurality of connecting holes include a third connecting hole 61 and a fourth connecting hole 62, a bottom of the third connecting hole 61 stops at the top connecting circuit 41, a bottom of the fourth connecting hole 62 stops at the bottom connecting circuit 42, so that the logic control unit 5 is connected to the control circuit through the third connecting hole 61 to implement an electrical connection between the first metal line 21 and the control circuit, and the second metal line 22 is electrically connected to the control circuit through the bottom connecting circuit 42 and the fourth connecting hole 62.

It should be noted that the above-mentioned sub-steps do not have to be executed in the order of a-d or a-e in the embodiment, for example, the sub-step S32b and the sub-step S32c may be executed in exchange order. According to needs of actual processes, some steps have sequence, for example: the sub-step S32c must be executed after the sub-step S32a, otherwise it will be very difficult to form the top connecting circuit after the storage unit and the logic storage circuit are attached. Similarly, the order of other steps may be adjusted by those of ordinary skilled in the art according to actual desires or existing processes may be added. The order of the steps or sub-steps in the following manufacturing method is the same, and will not be repeated.

In the method of this embodiment, the second metal line is disposed in the substrate of the storage unit and insulated from the substrate, the first metal line is disposed on the front of the storage unit, and then each connecting hole (including the first connecting hole to the fourth connecting hole) is formed. In this way, connection processes between the first metal line, the second metal line and the control circuit are implemented, a layout is reasonable and relatively simple, and the reliability of connection is improved. In addition, a logic of the control circuit is the same as the related art, a manufacturing process is simple and has a wide range of application prospects.

In an exemplary embodiment of the present disclosure, a method for manufacturing a three-dimensional memory is provided.

Figure 5:
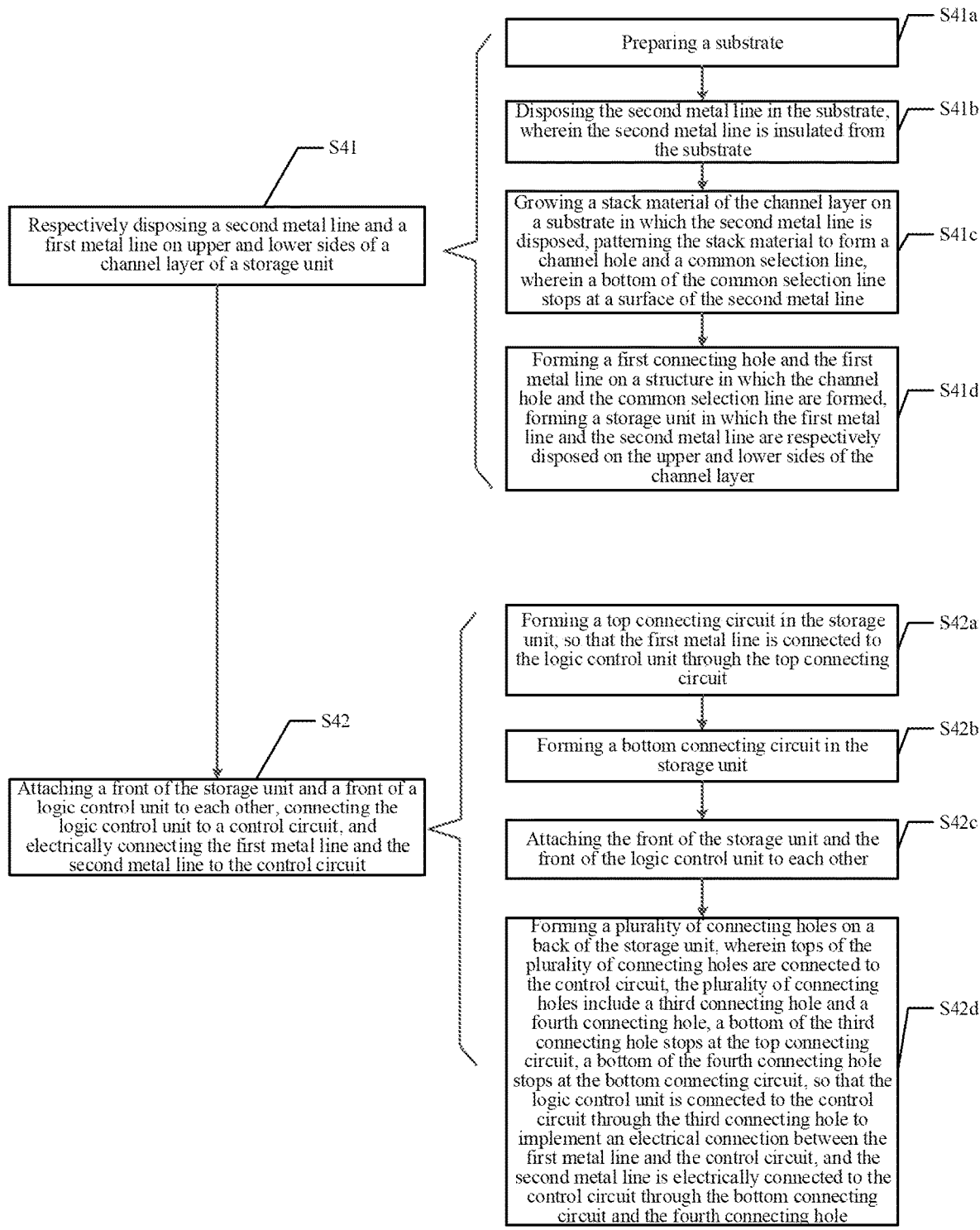
FIG. 5 shows a flowchart of a method for manufacturing the three-dimensional memory shown in FIG. 3 according to an embodiment of the present disclosure.

FIG. 5 is a flowchart of a method for manufacturing the three-dimensional memory shown in FIG. 3 according to an embodiment of the present disclosure.

Referring to FIG. 5, the method for manufacturing the three-dimensional memory of the present disclosure includes the following steps.

In step S41, a first metal line and a second metal line are disposed on lower and upper sides of a channel layer of a storage unit, respectively.

In this embodiment, the step S41 includes sub-step S41a, sub-step S41b, sub-step S41c, and sub-step S41d.

In sub-step S41a, a substrate 11 is prepared.

In sub-step S41b, a second metal line 22 is disposed in the substrate 11 and insulated from the substrate 11.

In sub-step S41c, a stack material of the channel layer 12 is grown on the substrate 11 in which the second metal line 22 is disposed, and the stack material is patterned to form a channel hole 13 and a common selection line 14, and a bottom of the common selection line 14 stops at a surface of the second metal line 22.

In sub-step S41d, a first connecting hole 31 and a first metal line 21 is formed on a structure in which the channel hole 13 and the common selection line 14 are formed, a storage unit 1 in which the first metal line 21 and the second metal line 22 are respectively disposed on the upper and lower sides of the channel layer 12 is formed.

In step S42, a front of the storage unit and a front of a logic control unit are attached to each other, the logic control unit is connected to a control circuit, and both the first metal line and the second metal line are electrically connected to the control circuit.

In this embodiment, the step S42 includes sub-step S42a, sub-step S42b, sub-step S42c, and sub-step S42d.

In sub-step S42a, a top connecting circuit 41 is formed in the storage unit 1, so that the first metal line 21 is connected to the logic control unit 5 through the top connecting circuit 41.

In sub-step S42b, a bottom connecting circuit 42 is formed in the storage unit 1.

In sub-step S42c, the front of the storage unit 1 and the front of the logic control unit 5 are attached to each other.

In sub-step S42d, a plurality of connecting holes are formed on a back of the storage unit 1, tops of the plurality of connecting holes are connected to the control circuit, the plurality of connecting holes include a third connecting hole 61 and a fourth connecting hole 62, a bottom of the third connecting hole 61 stops at the top connecting circuit 41, a bottom of the fourth connecting hole 62 stops at the bottom connecting circuit 42, so that the logic control unit 5 is connected to the control circuit through the third connecting hole 61 to implement an electrical connection between the first metal line 21 and the control circuit, and the second metal line 22 is electrically connected to the control circuit through the bottom connecting circuit 42 and the fourth connecting hole 62.

In the methods of manufacturing the embodiment shown in FIG. 3 and the embodiment shown in FIG. 2, a difference between the corresponding structures and the manufacturing processes is: in step S41 of the method for manufacturing the embodiment shown in FIG. 3, there is no process for forming the second connecting hole 32, and the bottom of the common selection line 14 directly stops at the surface of the second metal line 22.

In summary, the present disclosure provides the three-dimensional memory and the method for manufacturing the three-dimensional memory. The second metal line of the storage unit and the first metal line of the storage unit are respectively disposed on the upper and lower sides of the channel layer of the storage unit. By disposing the first metal line and the second metal line separately, the distribution of the metal lines becomes balanced, and the deformation of the storage unit is reduced or avoided, while the metal wiring is simplified by disposing the first metal line and the second metal line separately, so that the layouts of connecting paths between the first metal line, the second metal line and the control circuit are relatively simple, the reliability of connection is improved, and problems of connection reliability caused by complicated layouts and process problems in the related art are avoided. In the embodiments of the present disclosure, the second metal line is disposed in the substrate of the storage unit, the second metal line is insulated from the substrate, the first metal line is disposed on the front of the storage unit, and then each connecting hole (including the first connecting hole to the fourth connecting hole) is formed. In this way, the connection processes between the first metal line, the second metal line and the control circuit are implemented, the layout is reasonable and relatively simple, and the reliability of connection is improved. In addition, the logic of the control circuit is the same as that in the related art, the manufacturing process is simple and has the wide range of application prospects.

In the drawings, the same elements are represented by the same or similar reference numerals. When it may cause confusion in the understanding of the present disclosure, existing structures or configurations will be omitted. The shapes and sizes of the components in the drawings do not reflect the actual sizes and proportions, but merely illustrate the content of the embodiments of the present disclosure. In addition, in the claims, any reference signs located between parentheses should not be constructed to limit the claims.

The ordinal numbers used in the specification and claims, such as "first", "second", "third", etc., are used to modify the corresponding elements. The ordinal numbers do not mean that the component has any ordinal number, nor does it represent the order of a component and another component, or the order of the manufacturing method. The ordinal numbers are only used to clearly distinguish an element with a certain name from another element with the same name.

Furthermore, the terms "comprising" or "including" does not exclude the presence of elements or steps not listed in the claims. The word "a" or "an" preceding an element does not exclude the presence of multiple such elements.

Unless there are technical obstacles or contradictions, the various features in the above-mentioned embodiments of the present invention may be freely combined to form additional embodiments, and the additional embodiments are all within the protection scope of the present invention.

The specific embodiments described above further describe the purpose, technical solutions and beneficial effects of the present disclosure in further detail. It should be understood that the above descriptions are only specific embodiments of the present disclosure and are not intended to limit the present disclosure. Any modification, equivalent replacement, improvement, etc. made within the spirit and principle of the present disclosure shall be included in the protection scope of the present disclosure.

What is claimed is:

1. A three-dimensional memory, comprising:
    a storage unit; and
    a logic control unit,
    wherein a front of the storage unit and a front of the logic control unit are attached to each other, and the logic control unit is connected to a control circuit, and
    wherein a first metal line of the storage unit and a second metal line of the storage unit are disposed on lower and upper sides of a channel layer of the storage unit, respectively, and the first metal line and the second metal line are electrically connected to the control circuit, and
    wherein the second metal line is disposed in a substrate of the storage unit and insulated from the substrate.

2. The three-dimensional memory of claim 1, wherein the first metal line of the storage unit is disposed on the front of the storage unit.

3. The three-dimensional memory of claim 1, wherein a plurality of channel holes are disposed in the channel layer of the storage unit, and each of the plurality of channel holes is electrically connected to the first metal line; and a common selection line is electrically connected to the second metal line.

4. The three-dimensional memory of claim 3, wherein a top of the channel hole is electrically connected to the first metal line through a first connecting hole.

5. The three-dimensional memory of claim 3, wherein a bottom of the common selection line is directly electrically connected to the second metal line.

6. The three-dimensional memory of claim 3, wherein
    a bottom of the common selection line is electrically connected to the second metal line through a second connecting hole.

7. The three-dimensional memory of claim 1, wherein the first metal line is electrically connected to the logic control unit through a top connecting circuit; and
    the second metal line is electrically connected to the control circuit through a bottom connecting circuit.

8. The three-dimensional memory of claim 7, wherein a plurality of connecting holes are disposed on a back of the storage unit, tops of the plurality of connecting holes are connected to the control circuit, and the tops of the plurality of connecting holes respectively stop at the top connecting circuit and the bottom connecting circuit.

9. A method for manufacturing a three-dimensional memory, wherein the method comprises:
    respectively disposing a first metal line and a second metal line on lower and upper sides of a channel layer of a storage unit; and
    attaching a front of the storage unit and a front of a logic control unit to each other, connecting the logic control unit to a control circuit, and electrically connecting the first metal line and the second metal line to the control circuit,
    wherein respectively disposing a first metal line and a second metal line on lower and upper sides of a channel layer of a storage unit comprises:
    preparing a substrate; and
    disposing the second metal line in the substrate, wherein the second metal line is insulated from the substrate.

10. The method of claim 9, wherein,
    the respectively disposing a first metal line and a second metal line on lower and upper sides of a channel layer of a storage unit further comprises:
    epitaxially growing a substrate material on a substrate in which the second metal line is disposed, forming a second connecting hole on the epitaxially grown substrate material, and forming a substrate in which the second metal line and the second connecting hole are internally pre-arranged;
    growing a stack material of the channel layer on the substrate in which the second metal line and the second connecting hole are internally pre-arranged, patterning the stack material to form a channel hole and a common selection line, wherein a bottom of the common selection line stops at the second connecting hole; and forming a first connecting hole and the first metal line on a structure in which the channel hole and the common selection line are formed, and forming a storage unit in which the first metal line and the second metal line are respectively disposed on the upper and lower sides of the channel layer.

11. The method of claim 10, wherein the attaching a front of the storage unit and a front of a logic control unit to each other, connecting the logic control unit to a control circuit, and electrically connecting the first metal line and the second metal line to the control circuit comprise:

forming a top connecting circuit in the storage unit, so that the first metal line is connected to the logic control unit through the top connecting circuit;

forming a bottom connecting circuit in the storage unit;

attaching the front of the storage unit and the front of the logic control unit to each other;

forming a plurality of connecting holes on a back of the storage unit, wherein tops of the plurality of connecting holes are connected to the control circuit, the plurality of connecting holes comprises a third connecting hole and a fourth connecting hole, a bottom of the third connecting hole stops at the top connecting circuit, a bottom of the fourth connecting hole stops at the bottom connecting circuit, so that the logic control unit is connected to the control circuit through the third connecting hole to implement an electrical connection between the first metal line and the control circuit, and the second metal line is electrically connected to the control circuit through the bottom connecting circuit and the fourth connecting hole.

12. The method of claim 9, wherein, the respectively disposing a first metal line and a second metal line on lower and upper sides of a channel layer of a storage unit further comprises:

growing a stack material of the channel layer on a substrate in which the second metal line is disposed, patterning the stack material to form a channel hole and a common selection line, wherein a bottom of the common selection line stops at a surface of the second metal line; and forming a first connecting hole and the first metal line on a structure in which the channel hole and the common selection line are formed, and forming a storage unit in which the first metal line and the second metal line are respectively disposed on the upper and lower sides of the channel layer.

13. The method of claim 12, wherein the attaching a front of the storage unit and a front of a logic control unit to each other, connecting the logic control unit to a control circuit, and electrically connecting the first metal line and the second metal line to the control circuit comprise:

forming a top connecting circuit in the storage unit, so that the first metal line is connected to the logic control unit through the top connecting circuit;

forming a bottom connecting circuit in the storage unit;

attaching the front of the storage unit and the front of the logic control unit to each other;

forming a plurality of connecting holes on a back of the storage unit, wherein tops of the plurality of connecting holes are connected to the control circuit, the plurality of connecting holes comprises a third connecting hole and a fourth connecting hole, a bottom of the third connecting hole stops at the top connecting circuit, a bottom of the fourth connecting hole stops at the bottom connecting circuit, so that the logic control unit is connected to the control circuit through the third connecting hole to implement an electrical connection between the first metal line and the control circuit, and the second metal line is electrically connected to the control circuit through the bottom connecting circuit and the fourth connecting hole.

* * * * *